United States Patent [19]
Sugita et al.

[11] Patent Number: 6,071,759
[45] Date of Patent: Jun. 6, 2000

[54] METHOD FOR MANUFACTURING SEMICONDUCTOR APPARATUS

[75] Inventors: Junji Sugita; Junichi Fukuzaki; Yoshihiko Kawakami; Masatoshi Kojima, all of Niigata, Japan

[73] Assignee: Matsushita Electronics Corporation, Osaka, Japan

[21] Appl. No.: 08/893,687

[22] Filed: Jul. 11, 1997

[30] Foreign Application Priority Data

Jul. 15, 1996 [JP] Japan .................................. 8-184617

[51] Int. Cl.[7] ...................................................... H01L 21/44
[52] U.S. Cl. ............................................. 438/118; 438/123
[58] Field of Search ................................... 438/118, 123, 438/106, 457, 458, 612, 15, 121

[56] References Cited

U.S. PATENT DOCUMENTS

| | | | |
|---|---|---|---|
| 4,740,830 | 4/1988 | Ketley | 357/67 |
| 4,908,078 | 3/1990 | Muramatsu et al. | 148/439 |
| 5,177,032 | 1/1993 | Fogal et al. | 438/220 |
| 5,304,842 | 4/1994 | Farnworth et al. | 257/668 |
| 5,411,921 | 5/1995 | Negoro | 438/217 |
| 5,476,565 | 12/1995 | Akada et al. | 156/235 |
| 5,532,910 | 7/1996 | Suzuki et al. | 361/813 |
| 5,605,763 | 2/1997 | Yusa et al. | 428/473.5 |
| 5,661,900 | 9/1997 | McLellan et al. | 29/827 |
| 5,956,563 | 9/1999 | Klink et al. | 438/5 |

FOREIGN PATENT DOCUMENTS

WO 96/39714  12/1996  WIPO .

*Primary Examiner*—Wael Fahmy
*Assistant Examiner*—Kurt Eaton
*Attorney, Agent, or Firm*—McDermott, Will & Emery

[57] ABSTRACT

In a hardening temperature profile of a paste material for fixing a lead-frame to a semiconductor chip, a heating temperature from a first sub-zone to a third sub-zone is set to 150° C. and a heating temperature from a fourth sub-zone to a sixth sub-zone is set to a maximum value of 230° C. at a first heating step of a chip fixing step. Then, in the hardening temperature profile, a heating temperature of a seventh sub-zone is set to 180° C. having a drop width from the sixth sub-zone of 50 degrees and a heating temperature of an eighth sub-zone is set to 130° C. having a drop width from the seventh sub-zone of 50 degrees at a second heating step of the chip fixing step.

8 Claims, 8 Drawing Sheets

Fig. 6

|  | BONDING STRENGTH | WARPAGE OF CHIP |
|---|---|---|
| FIRST HARDENING TEMPERATURE PROFILE | SLIGHTLY LOW | SMALL |
| SECOND HARDENING TEMPERATURE PROFILE | EXCELLENT | NONE |
| PRIOR ART | LOW | LARGE |
| COMPARATIVE EXAMPLE | LOW | LARGE |

METHOD FOR MANUFACTURING SEMICONDUCTOR APPARATUS

BACKGROUND OF THE INVENTION

The present invention relates to a method for manufacturing a semiconductor apparatus, and more particularly to a hardening temperature profile of a paste material applied to a lead-frame at a die bonding process.

A procedure for manufacturing a semiconductor apparatus comprises a die bonding process of applying a paste material to a die-pad of a lead-frame and then attaching a chip part formed of a semiconductor to the lead-frame by pressure, and a thermally hardening process of leaving the lead-frame and the chip part for a predetermined time at a high temperature of about 100 to 250° C. and hardening the paste material between the lead-frame and the chip part to fix the chip part and the lead-frame to each other.

Conventionally, a lead-frame formed of a ferroalloy which mainly comprises iron referred to as a "42 alloy" has been used for the lead-frame of the semiconductor apparatus (hereinafter referred to as a "Fe lead-frame"). In recent years, a lead-frame formed of a copper alloy which mainly comprises copper has been used (hereinafter referred to as a "Cu lead-frame").

However, there is a problem that various bonding failures are caused as shown in FIGS. 7 (a) and 7 (b) at the thermally hardening process of fixing the lead-frame and the chip part to each other by using a paste material including a thermosetting resin or the like.

More specifically, a chip—paste bonding failure is caused in which a paste material 103 between a lead-frame 101 and a chip part 102 peels off the chip part 102 as shown in FIG. 7 (a), or a cohesive failure is caused in which the paste material 103 bonded to the lead-frame 101 and the chip part 102 therebetween is broken as shown in FIG. 7 (b). In a Cu lead-frame 101A formed by laminating an outer metal layer 101a formed of palladium (Pd) or gold (Au) and an inner metal layer 101b formed of a copper alloy in order to enhance characteristics of the semiconductor apparatus, a lead-frame—paste bonding failure is easily caused in which the paste material 103 between the Cu lead-frame 101A and the chip part 102 peels off the Cu lead-frame 101A as shown in FIG. 7 (c).

SUMMARY OF THE INVENTION

In order to solve the above-mentioned problems of the prior art, it is an object of the present invention to eliminate a bonding failure between a lead-frame and a semiconductor chip.

The present invention provides a method for manufacturing a semiconductor apparatus, comprising the steps of pressing a semiconductor chip onto a die-pad of a lead-frame to which a paste material is applied, and heating to harden the paste material between the die-pad and the semiconductor chip to a predetermined temperature and then dropping a heating temperature to fix the semiconductor chip to the die-pad of the lead-frame.

According to the method for manufacturing a semiconductor apparatus of the present invention, the paste material between the lead-frame and the semiconductor chip is heated to a predetermined temperature and the paste material is then hardened while gradually dropping the heating temperature to fix the semiconductor chip to the die-pad of the lead-frame. Consequently, a rapid change of a temperature given to the lead-frame and the semiconductor chip can be relieved. Therefore, the lead-frame and the chip part can thermally shrink slowly and a warpage of the chip part can be reduced. As a result, a bonding failure can be inhibited from being caused between the lead-frame and the chip part.

Preferably, the step of gradually dropping the heating temperature at the chip fixing step includes a step of gradually decreasing a temperature drop rate at which the heating temperature is dropped from the predetermined temperature. Consequently, the rapid change of the temperature given to the lead-frame and the chip part can further be relieved. Therefore, the lead-frame and the chip part can thermally shrink more slowly and the warpage of the chip part can be reduced still more. As a result, the bonding failure can further be inhibited from being caused between the lead-frame and the chip part.

Preferably, the step of gradually dropping the heating temperature at the chip fixing step includes a step of gradually decreasing a temperature drop rate for a unit time at which the heating temperature is dropped from the predetermined temperature. Consequently, the rapid change of the temperature given to the lead-frame and the chip part can further be relieved. Therefore, the lead-frame and the chip part can thermally shrink more slowly and the warpage of the chip part can be eliminated. As a result, the bonding failure can surely be inhibited from being caused between the lead-frame and the chip part.

Preferably, the lead-frame is formed of a metal including iron. Thus, the lead-frame formed of a metal including iron has a thermal expansion coefficient and a thermal shrinkage coefficient which are close to those of a chip part formed of a semiconductor. Therefore, the bonding failure can surely be inhibited from being caused between the lead-frame and the chip part.

Preferably, the lead-frame is formed of a metal including copper. Thus, the lead-frame including copper has a thermal expansion coefficient and a thermal shrinkage coefficient which are greatly different from those of the chip part formed of the semiconductor. Therefore, the rapid change of the temperature given to the lead-frame and the chip part can be relieved irrespective of a great stress generated between the lead-frame and the chip part. Therefore, the bonding failure shall be inhibited from being caused between the lead-frame and the chip part.

Preferably, the lead-frame is obtained by laminating a metal layer formed of palladium or gold on a top face thereof. Thus, a surface of the lamination is very flat and smooth. A bonding strength of the paste material to the metal layer is lowered so that the stress caused by differences between the thermal expansion coefficients and the thermal shrinkage coefficients of the chip part and the lead-frame is increased. However, the rapid change of the temperature given to the lead-frame and the chip part can be relieved. Therefore, even if the lead-frame is formed by laminating the metal layer formed of palladium or gold, the bonding failure can surely be inhibited from being caused between the lead-frame and the chip part.

BRIEF DESCRIPTION OF THE DRAWINGS

FIG. 6 is a table showing results of comparison of the method for manufacturing a semiconductor apparatus using the hardening temperature profiles according to the embodiment of the present invention and hardening temperature profiles according to the prior art and a comparative example;

DETAILED DESCRIPTION OF THE INVENTION

An embodiment of the present invention will be described below with reference to the drawings.

Figure 1:
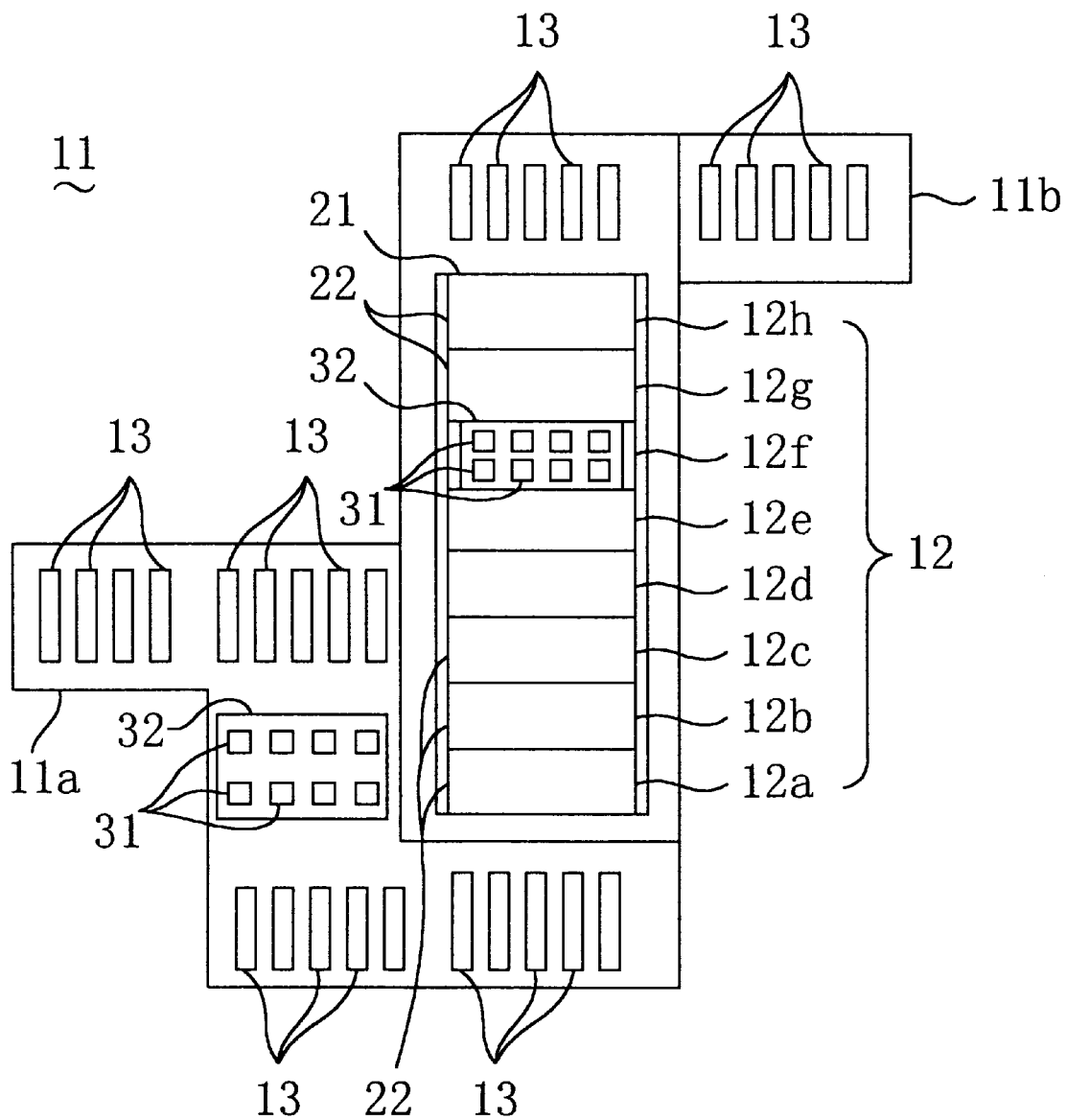
FIG. 1 is a plan view showing a hardening device used for a method for manufacturing a semiconductor apparatus according to an embodiment of the present invention.

FIG. 1 shows a planar structure of a hardening device used for a heat treatment at first and second heating steps of a method for manufacturing a semiconductor apparatus according to the embodiment of the present invention. A hardening device 11 shown in FIG. 1 is the same as a hardening device according to the prior art, and is put in a nitrogen atmosphere to prevent oxidation of a lead-frame. The hardening device 11 comprises a loader section 11a for sending in a lead-frame 32 formed of Fe or Cu and an unloader section 11b for sending out the lead-frame 32 which has been heat treated. The lead-frame 32 has plural die-pads (not shown) to which a silver paste material is applied and onto which a chip part 31 is fixed by pressure. A heating zone 12 for heating, at a predetermined temperature, the lead-frame 32 onto which the chip part 31 is fixed by pressure is provided between the loader section 11a and the unloader section 11b.

As shown in FIG. 1, the heating zone 12 is divided into eight sub-zones including a first sub-zone 12a, a second sub-zone 12b, a third sub-zone 12c, . . . , an eight sub-zone 12h. Each sub-zone 12a, 12b, 12c, . . . 12h has a heater block 22 provided thereon. A heater 21 capable of independently controlling a temperature is incorporated in the heater block 22.

A lot of rollers 13 for delivering the lead-frame 32 are provided between the loader section 11a of the hardening device 11 and the first sub-zone 12a of the heating zone 12 and between the eighth sub-zone 12h of the heating zone 12 and the unloader section 11b of the hardening device 11.

Figure 2:
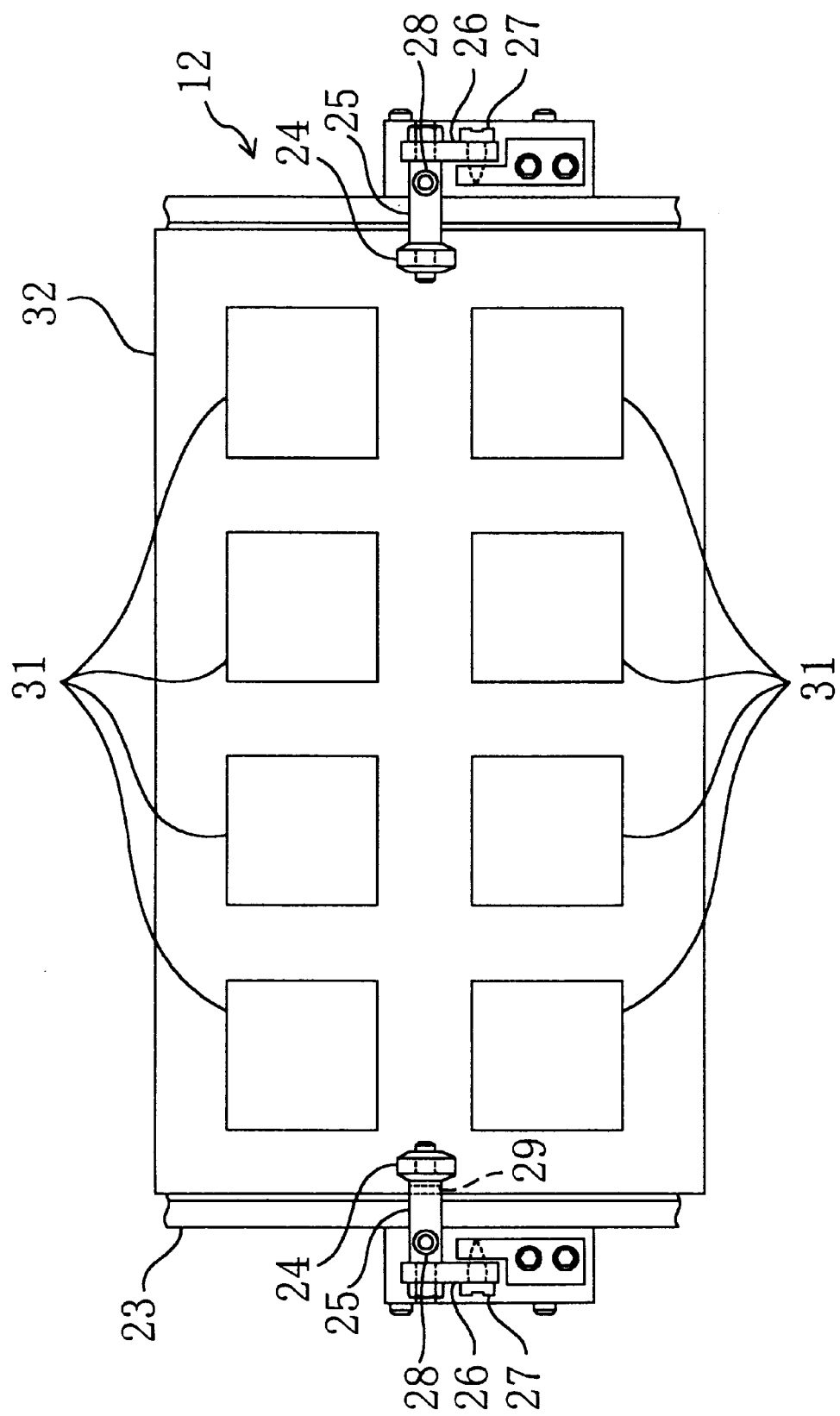
FIG. 2 is a partial plan view showing a heating zone in the hardening device used for the method for manufacturing a semiconductor apparatus according to the embodiment of the present invention.
Figure 3:
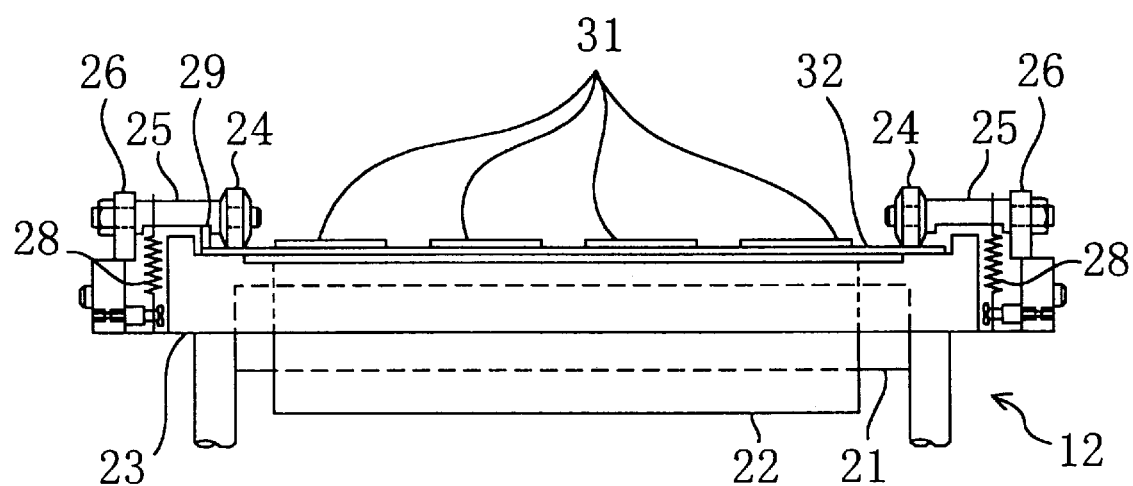
FIG. 3 is an elevational view showing the heating zone in the hardening device used for the method for manufacturing a semiconductor apparatus according to the embodiment of the present invention.

FIG. 2 is a partial plan view showing the heating zone 12 in the hardening device 11 according to the present embodiment, in which the lead-frame 32 and a delivery mechanism are shown. FIG. 3 is an elevational view showing the heating zone 12 in the hardening device 11. As shown in FIG. 2 or 3, a delivery path 23 in the heating zone 12 of the hardening device 11 has the heater block 22 provided for each sub-zone on the underside of a central portion thereof. The heater 21 for heating the lead-frame 32 at a temperature corresponding to a predetermined temperature hardening profile is incorporated in the heater block 22. A delivery roller 24 for rolling in a delivery direction is provided at regular intervals on both sides of the delivery path 23. The delivery roller 24 is removably supported by a pin 27 through a sliding arm 26 provided on a rotary shaft 25. The rotary shaft 25 has a spring 28 suspended downward. The delivery roller 24 is caused to properly come in contact with a side portion of the lead-frame 32 by tension of the spring 28. A temperature sensor 29 is provided on the rotary shaft 25 of the delivery roller 24. The temperature sensor 29 comes in contact with an upper face of the lead-frame 32 to which the die-pad and the chip part 31 are fixed with a silver paste material by pressure and serves to detect a temperature of the upper face of the lead-frame 32.

Thus, each lead-frame 32 approaches the heater block 22 in the delivery path 23 of the heating zone 12 of the hardening device 11 and sequentially passes at a predetermined temperature and at a predetermined speed capable of obtaining a predetermined time so as to harden the silver paste material from the first sub-zone 12a to the eighth sub-zone 12h.

If the hardening device 11 having the above-mentioned structure is used, a plurality of chip parts 31 are fixed, by pressure, to the silver paste material applied to the die-pad and then the temperature of the upper face of the lead-frame 32 delivered to the hardening device 11 can be detected by using the temperature sensor 29 at a chip pressing step. Therefore, a temperature of each lead-frame 32 delivered on the delivery path 23 can be controlled in accordance with a hardening temperature profile which will be described below. Consequently, the lead-frame 32 is heated to a predetermined temperature by heat generated by the heater block 22 so that the silver paste material between the chip part 31 and the lead-frame 32 can be hardened. Thus, the chip part 31 and the lead-frame 32 can surely be fixed to each other.

By using the hardening device 11 having the above-mentioned structure, a method for controlling the hardening temperature of the silver paste material according to the present embodiment will be described below with reference to the drawings.

Figure 4A:
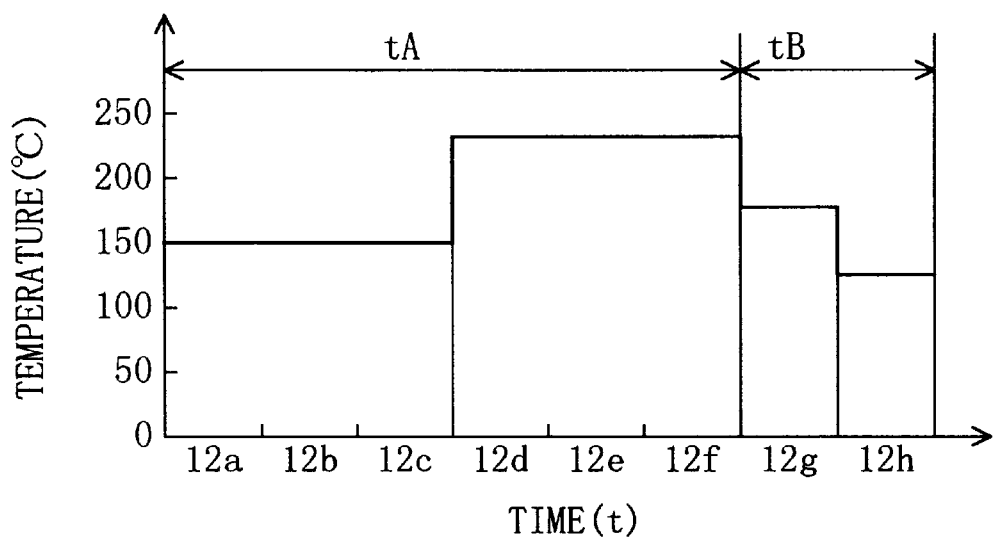
FIGS. 4 (a) and 4 (b) show hardening temperature profiles of a chip fixing step of the method for manufacturing a semiconductor apparatus according to the embodiment of the present invention, FIG. 4 (a) being a graph showing a first hardening temperature profile of a temperature difference—zone width constant drop type, and FIG. 4 (b) being a graph showing a second hardening temperature profile of a temperature difference gradual decrease—zone width constant drop type.
Figure 4B:
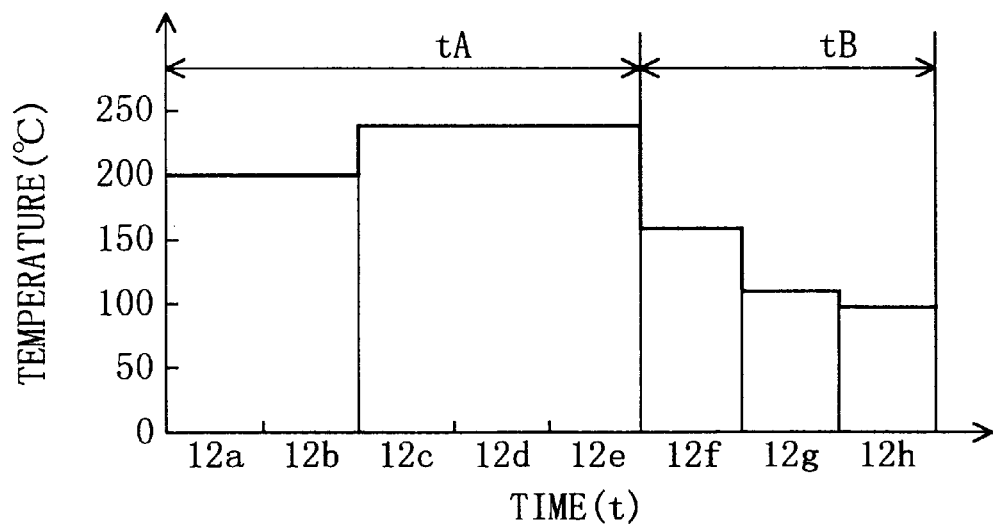

FIGS. 4 (a) and 4 (b) show a hardening temperature profile at the chip fixing step of the method for manufacturing a semiconductor apparatus according to the present embodiment. The chip fixing step includes a first heating step tA of heating to a maximum heating temperature and a second heating step tB of gradually dropping the heating temperature. FIG. 4 (a) shows a first hardening temperature profile of a temperature difference—zone width constant drop type in which a drop temperature at the second heating step tB has a constant temperature difference dropped for each sub-zone and a constant sub-zone number of the heating zone 12 keeping a predetermined temperature, and FIG. 4 (b) shows a second hardening temperature profile of a temperature difference gradual decrease—zone width constant drop type in which the drop temperature at the second heating step tB has a temperature difference dropped for each sub-zone gradually decreased and a constant sub-zone number of the heating zone 12 keeping a predetermined temperature. A delivery speed of the lead-frame 32 in each of the sub-zones 12a to 12h of the heating zone 12 is constant.

In the first hardening temperature profile shown in FIG. 4 (a), the heating temperature from the first sub-zone 12a to the third sub-zone 12c of the heating zone 12 of the hardening device 11 is set to 150° C. and the heating temperature from the fourth sub-zone 12d to the sixth sub-zone 12f is set to a maximum value of 230° C. at the first heating step tA, and the heating temperature of the seventh sub-zone 12g is set to 180° C. having a drop width from the sixth sub-zone 12f of 50 degrees and the heating temperature of the eighth sub-zone 12h is set to 130° C. having a drop width from the seventh sub-zone of 50 degrees at the second heating step tB.

In the second hardening temperature profile shown in FIG. 4 (b), the heating temperature from the first sub-zone 12a to the second sub-zone 12b of the heating zone 12 of the hardening device 11 is set to 200° C. and the heating temperature from the third sub-zone 12c to the fifth sub-zone 12e is set to a maximum value of 230° C. at the first heating step tA, and the heating temperature of the sixth sub-zone 12f is set to 150° C. having a drop width from the fifth sub-zone 12e of 80 degrees, the heating temperature of the seventh sub-zone 12g is set to 120° C. having a drop width from the sixth sub-zone 12f of 30 degrees and the heating temperature of the eighth sub-zone 12h is set to 100° C. having a drop width from the seventh sub-zone 12g of 20 degrees at the second heating step tB.

In the second hardening temperature profile, a temperature at start of heating is set to 200° C. which is higher by 50 degrees than in the first hardening temperature profile. The reason is that a time to cause the heating temperature to reach a maximum value should be shortened such that a temperature drop time becomes longer at the second heating step tB after the heating temperature reaches the maximum value at the first heating step tA.

There will be described results of comparison of bonding strengths and warpages of a semiconductor apparatus manufactured through the first and second heating steps tA and tB having the hardening temperature profiles according to the present embodiment and semiconductor apparatus manufactured by using methods according to the prior art and a comparative example.

Figure 8A:
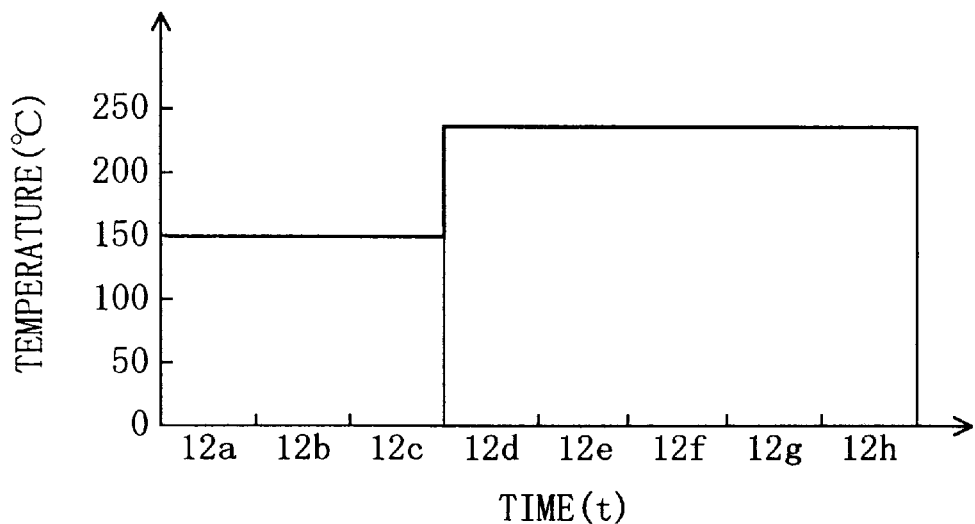
FIGS. 8 (a) and 8 (b) show hardening temperature profiles in the method for manufacturing a semiconductor apparatus, FIG. 8 (a) being a graph showing the hardening temperature profile according to the prior art, and FIG. 8 (b) being a graph showing the hardening temperature profile for comparison.
Figure 8B:
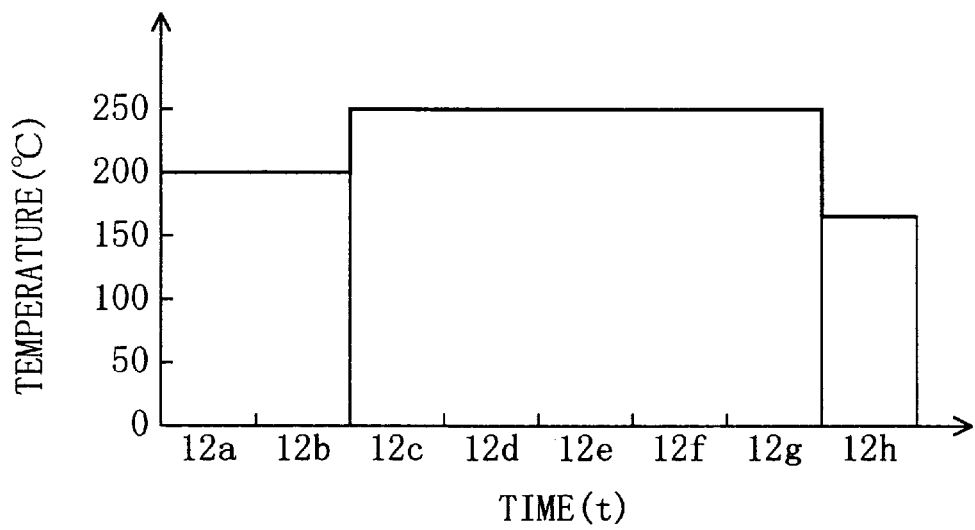

First of all, hardening temperature profiles of the manufacturing methods according to the prior art and the comparative example will be described below. FIG. 8 (a) shows a hardening temperature profile at a thermally hardening step according to the prior art, in which a heating temperature from the first sub-zone 12a to the third sub-zone 12c of the heating zone 12 of the hardening device 11 is set to 150° C. and a heating temperature from the fourth sub-zone 12d to the eighth sub-zone 12h is set to a maximum value of 230° C. FIG. 8 (b) shows a hardening temperature profile at a thermally hardening step for comparison, in which a heating temperature from the first sub-zone 12a to the second sub-zone 12b of the heating zone 12 of the hardening device 11 is set to 200° C., the heating temperature from the third sub-zone 12c to the seventh sub-zone 12g is set to a maximum value of 250° C., and the heating temperature of the eighth sub-zone 12h is set to 170° C. having a drop width from the seventh sub-zone 12g of 80 degrees.

FIG. 6 shows a table of results of comparison of a method for manufacturing a semiconductor apparatus using the first and second hardening temperature profiles according to the present embodiment and the hardening temperature profiles according to the prior art and the comparative example, in which a Cu lead-frame formed by laminating an upper metal layer formed of palladium or gold and a lower metal layer formed of a copper alloy is employed. As shown in FIG. 6, in the case where the hardening temperature profiles according to the prior art and the comparative example are used, the bonding strength is lower than a predetermined value and the warpage of a chip part is large. On the other hand, in the case where the first hardening temperature profile of a temperature difference—zone width constant drop type according to the present embodiment is used, the bonding strength is slightly lowered and the warpage of the chip part is small. Furthermore, in the case where the second hardening temperature profile of a temperature difference gradual decrease—zone width constant drop type according to the present embodiment is used, the bonding strength is excellent and the warpage of the chip part is not caused.

In general, the Cu lead-frame has a smaller bonding strength than that of a Fe lead-frame and a chip part thereof is easily warped. A thermal expansion coefficient and a thermal shrinkage coefficient of the Cu lead-frame are $17.7 \times 10^{-6}/°$ C. which is greater than $4.5 \times 10^{-6}/°$ C. to $5.8 \times 10^{-6}/°$ C. of a thermal expansion coefficient and a thermal shrinkage coefficient of the Fe lead-frame. Accordingly, the thermal expansion coefficient and the thermal shrinkage coefficient of the Cu lead-frame have great differences from $4.2 \times 10^{-6}/°$ C. of a thermal expansion coefficient and a thermal shrinkage coefficient of the chip part during heat treatment. Therefore, when cooling the lead-frame to almost a room temperature, the difference in the thermal shrinkage coefficient is left as a stress. Consequently, the paste material easily peels. Furthermore, in the case where the Cu lead-frame of a lamination type having the upper metal layer formed of palladium or gold is used, a surface of the upper metal layer is very flat and smooth. For this reason, a bonding strength of the paste material to the upper metal layer is reduced. As a result, the stress caused by the differences of the thermal expansion coefficients and the thermal shrinkage coefficients between the chip part and the Cu lead-frame is increased.

According to the present embodiment, thus, also in the case where the Cu lead-frame which is easily affected by the stress or the Cu lead-frame of a lamination type having the upper metal layer whose surface is flat is used, the second heating step tB of heating the paste material at a temperature which is gradually dropped from a maximum temperature is provided after the first heating step tA of heating the paste material at the maximum temperature. Therefore, the lead-frame and the chip part do not accept a great temperature difference. Thus, the lead-frame and the chip part can be prevented from thermally shrinking rapidly. Accordingly, the bonding strength of the paste material is lowered with difficulty, and the lead-frame and the chip part can be prevented from being warped. Consequently, bonding failures between the lead-frame and the chip part are not caused easily.

Furthermore, in the case where the second hardening temperature profile of a temperature difference gradual decrease—zone width constant drop type is used in which a unit time temperature drop rate for dropping the temperature for a unit time from a maximum temperature is gradually decreased, the bonding strength becomes excellent and the warpages of the lead-frame and the chip part can be prevented still more.

Figure 5A:
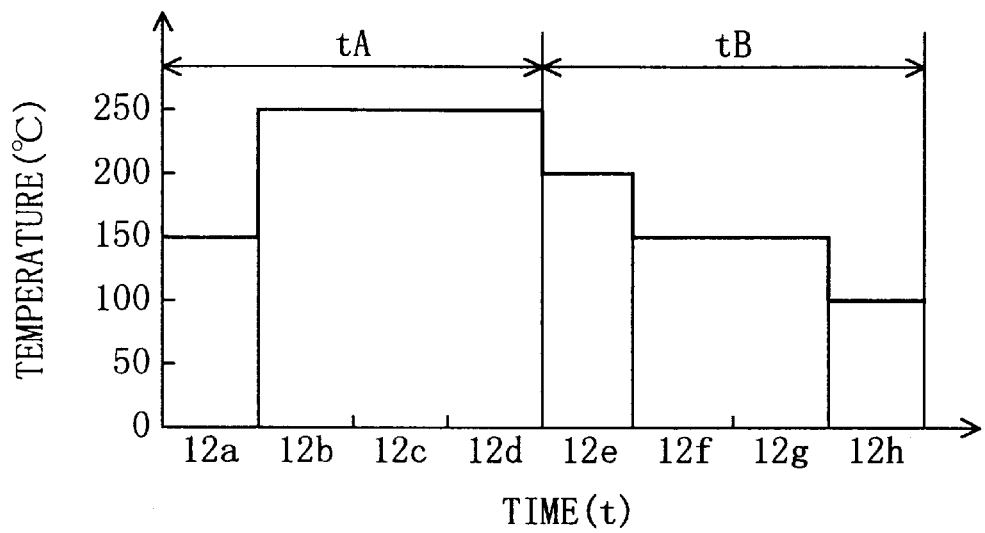
FIGS. 5 (a) and 5 (b) show hardening temperature profiles of the chip fixing step of the method for manufacturing a semiconductor apparatus according to the embodiment of the present invention, FIG. 5 (a) being a graph showing a third hardening temperature profile of a temperature difference constant—zone width gradual increase drop type, and FIG. 5 (b) being a graph showing a fourth hardening temperature profile of a temperature difference gradual decrease—zone width gradual increase drop type.
Figure 5B:
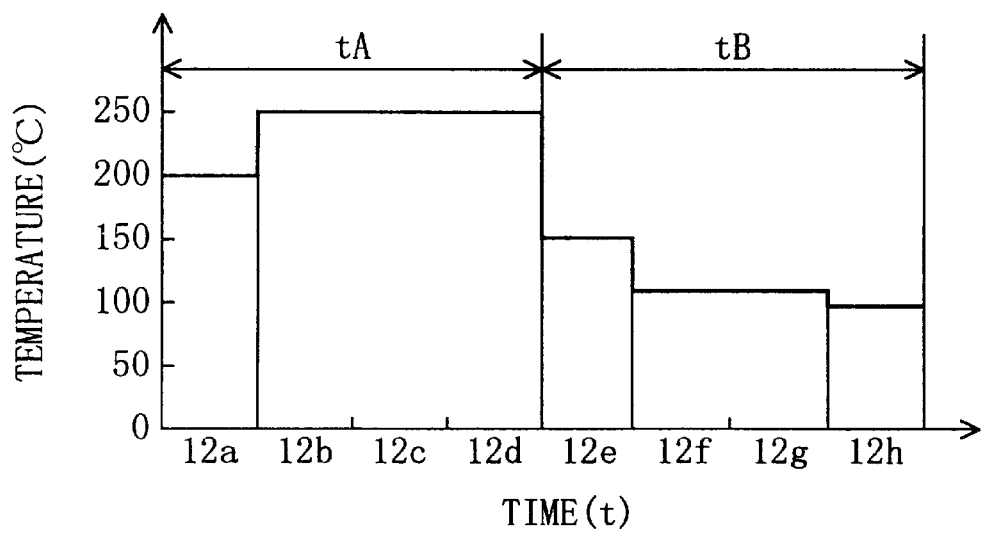
Figure 7A:
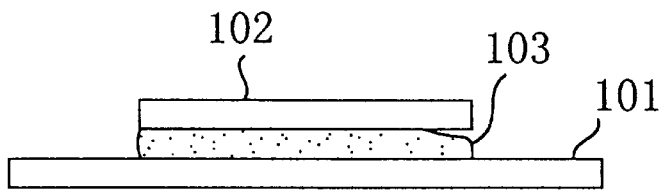
FIGS. 7 (a), 7 (b) and 7 (c) show bonding failures generated between a lead-frame and a chip part according to the prior art, FIG. 7 (a) being an elevational view showing a chip—paste bonding failure, FIG. 7 (b) being an elevational view showing a cohesive failure, and FIG. 7 (c) being an elevational view showing a lead-frame—paste bonding failure.
Figure 7B:
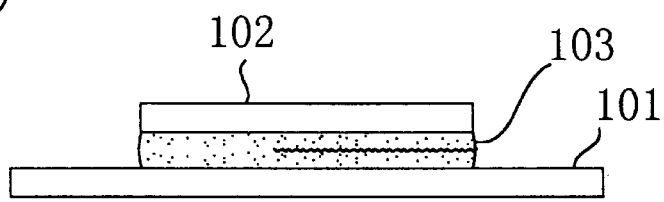
Figure 7C:
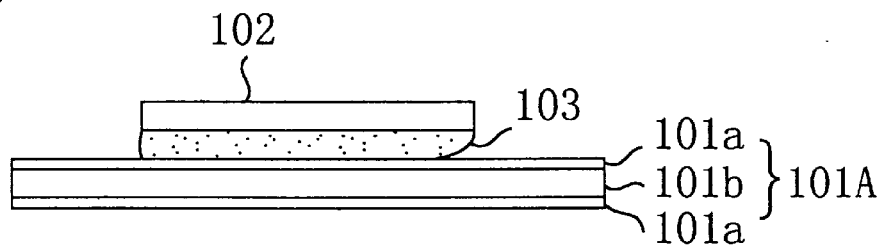

In place of the first and second hardening temperature profiles, a hardening temperature profile shown in FIG. 5 (*a*) or 5 (*b*) may be used. More specifically, it is possible to use a third hardening temperature profile of a temperature difference constant—zone width gradual increase drop type in which the drop temperature at the second heating step tB has a constant temperature difference dropped for each sub-zone and gradually increases a sub-zone number of the heating zone 12 keeping a predetermined temperature as shown in FIG. 5 (*a*), or to use a fourth hardening temperature profile of a temperature difference gradual decrease—zone width gradual increase drop type in which the drop temperature at the second heating step tB gradually decreases the dropped temperature difference and gradually increases the sub-zone number of the heating zone 12 keeping the predetermined temperature as shown in FIG. 5 (*b*).

As shown in the second, third and fourth hardening temperature profiles, if the second heating step tB is set in such a manner that a unit time temperature drop rate for dropping a temperature for a unit time from a predetermined temperature is gradually decreased, the lead-frame and the chip part can further be prevented from thermally shrinking rapidly. Consequently, the bonding failure between the lead-frame and the chip part can be inhibited still more.

In the hardening device 11 used for implementing the method for manufacturing a semiconductor apparatus according to the present embodiment, the heating zone 12 is divided into eight sub-zones. If the heating zone 12 is divided into more sub-zones, a temperature drop of the hardening temperature profile is smoothly changed. Consequently, it is apparent that a temperature change rate is reduced more effectively. The hardening device 11 is only an example. It is preferred that a heat treatment device capable of implementing the hardening temperature profile at the first heating step tA and the temperature hardening step tB according to the present embodiment should be used.

While the Fe or Cu lead-frame 32 has been used and the silver paste has been used as the paste material for fixing the lead-frame 32 to the chip part 31, any conductive lead-frame can be used. Preferably, a thermosetting paste material suitable for bonding the conductive lead-frame to the chip part 31 is used.

We claim:

1. A method for manufacturing a semiconductor apparatus, comprising the steps of:

pressing a semiconductor chip onto a die-pad of a lead frame to which a paste material is applied; and heating the paste material between the die-pad and the semiconductor chip to a predetermined temperature so as to harden the paste material and then gradually dropping a heating temperature to fix the semiconductor chip to the die-pad of the lead frame, said gradual dropping of said heating temperature comprising decreasing the heating temperature by predetermined discrete increments so as to apply a plurality of predetermined cooling temperatures, each of said predetermined cooling temperatures being applied for a predetermined period of time.

2. The method for manufacturing a semiconductor apparatus according to claim 1, wherein the lead frame is formed of a metal including copper.

3. The method for manufacturing a semiconductor apparatus according to claim 1, wherein the lead frame is formed by laminating a metal layer formed of palladium or gold on a top surface thereof.

4. The method for manufacturing a semiconductor apparatus according to claim 1, wherein the lead frame is formed of a metal including copper, which is laminated with a metal layer formed of a palladium or a gold on a top surface thereof.

5. The method for manufacturing a semiconductor apparatus, comprising the steps of:

pressing a semiconductor chip onto a die-pad of a lead frame to which a paste material is applied; and heating the paste material between the die-pad and the semiconductor chip to a predetermined temperature so as to harden the paste material and then gradually dropping a heating temperature to fix the semiconductor chip to the die-pad of the lead frame, said gradual dropping of said heating temperature comprising decreasing the heating temperature by predetermined discrete increments so as to apply a plurality of predetermined cooling temperatures, each of said predetermined cooling temperatures being applied for a predetermined period of time, wherein said predetermined discrete increments become progressively smaller.

6. The method for manufacturing a semiconductor apparatus according to claim 5, wherein the lead frame is formed of a metal including copper.

7. The method for manufacturing a semiconductor apparatus according to claim 5, wherein the lead frame is formed by laminating a metal layer formed of palladium or gold on a top surface thereof.

8. The method for manufacturing a semiconductor apparatus according to claim 5, wherein the lead frame is formed of a metal including copper, which is laminated with a metal layer formed of a palladium or a gold on a top surface thereof.

* * * * *